United States Patent
Dinan et al.

(10) Patent No.: US 11,394,418 B2
(45) Date of Patent: Jul. 19, 2022

(54) WATCH INCORPORATING CAR KEY

(71) Applicant: ARMOUR SURVEILLANCE SECURITY EQUIPMENT AND TECHNOLOGY LTD, London (GB)

(72) Inventors: Richard Dinan, Beaconsfield (GB); Patrick James Fawcett, Upper Colwell (GB)

(73) Assignee: Armour Surveillance Security Equipment and Technology LTD, London (GB)

( * ) Notice: Subject to any disclaimer, the term of this patent is extended or adjusted under 35 U.S.C. 154(b) by 0 days.

(21) Appl. No.: 16/940,676

(22) Filed: Jul. 28, 2020

(65) Prior Publication Data
US 2021/0036728 A1    Feb. 4, 2021

(30) Foreign Application Priority Data

Jul. 29, 2019 (GB) ...................... 1910793

(51) Int. Cl.
*H04B 1/3827* (2015.01)
*B60R 25/24* (2013.01)
(Continued)

(52) U.S. Cl.
CPC ............. *H04B 1/385* (2013.01); *B60R 25/01* (2013.01); *B60R 25/245* (2013.01); *G04G 17/04* (2013.01);
(Continued)

(58) Field of Classification Search
CPC ...... H04B 1/385; G07C 9/00174; G07C 9/20; G07C 2009/00968; G07C 9/00944;
(Continued)

(56) References Cited

U.S. PATENT DOCUMENTS 4,780,864 A * 10/1988 Houlihan ............. G01C 22/002
324/160
4,931,789 A *  6/1990 Pinnow ............... G07C 9/00857
340/5.64
(Continued)

FOREIGN PATENT DOCUMENTS

EP          3435479 A1    1/2019
KR    20170004081 U    12/2017

OTHER PUBLICATIONS https://www.theverge.com/2017/11/9/16623836/fossil-q-activist-hybrid-smartwatch-review; Bohn, 9 pages, Nov. 9, 2017. (Year: 2017).*

(Continued)

*Primary Examiner* — Brian E Miller
(74) *Attorney, Agent, or Firm* — Meunier Carlin & Curfman LLC

(57) ABSTRACT

The present invention provides a wearable device comprising a mechanical watch movement located within a watch housing, and first and second straps connected to the watch housing, such that the device is suitable for wearing on a user's wrist. The first strap has a coin cell located in a cavity, and the second strap has a first electronic communication device located in a cavity. The coin cell and the electronic communication device are connected by a flexible circuit board. Advantageously, this may provide a wearable device having the functionality to interact with a remote security system of a vehicle, such as a keyless entry system or a keyless go system.

14 Claims, 6 Drawing Sheets

(51) Int. Cl.
    *G04G 17/04*     (2006.01)
    *G04G 21/04*     (2013.01)
    *G07C 9/00*     (2020.01)
    *H05K 1/02*     (2006.01)
    *G06F 1/16*     (2006.01)
    *B60R 25/01*     (2013.01)
    *G04G 17/08*     (2006.01)

(52) U.S. Cl.
    CPC ............ *G04G 17/08* (2013.01); *G04G 21/04* (2013.01); *G07C 9/00174* (2013.01); *G06F 1/16* (2013.01); *H05K 1/0278* (2013.01)

(58) Field of Classification Search
    CPC ... G07C 9/00309; B60R 25/01; B60R 25/245; G04G 17/04; G04G 17/08; G04G 21/04; H05K 1/0278; H05K 2201/09872; H05K 3/284; H05K 1/189; H05K 3/4691; G06K 19/07762; A44C 5/00; G04B 47/005
    See application file for complete search history.

(56) References Cited

U.S. PATENT DOCUMENTS

| | | | | |
|---|---|---|---|---|
| 5,767,457 | A * | 6/1998 | Gerpheide | G06F 3/0488 178/18.03 |
| 6,282,152 | B1 * | 8/2001 | Kurple | G04G 9/0064 340/12.28 |
| 6,734,790 | B1 * | 5/2004 | Hodger | B60R 25/102 340/7.61 |
| 6,915,490 | B1 * | 7/2005 | Ewing | G06F 3/0481 715/794 |
| 7,081,905 | B1 * | 7/2006 | Raghunath | G06F 1/163 345/684 |
| 7,102,507 | B1 * | 9/2006 | Lauren | G07C 9/00182 340/12.55 |
| 9,551,978 | B2 * | 1/2017 | Modaragamage | G04B 37/1486 |
| 9,744,943 | B1 * | 8/2017 | Hiatt | G04G 17/08 |
| 9,760,698 | B2 * | 9/2017 | Pisz | B60R 25/20 |
| 9,824,833 | B2 * | 11/2017 | Fertl | G04G 21/08 |
| 9,940,769 | B2 * | 4/2018 | Wooley | G07C 9/00944 |
| 10,020,565 | B2 * | 7/2018 | Lee | H02J 50/12 |
| 10,395,161 | B2 * | 8/2019 | Shahin | G06K 19/0723 |
| 10,474,194 | B1 * | 11/2019 | Ell | G06F 1/1656 |
| 10,688,962 | B2 * | 6/2020 | House | G04G 9/0064 |
| 10,768,581 | B2 * | 9/2020 | Wang | G06F 1/263 |
| 10,849,392 | B1 * | 12/2020 | Wittenberg | G04C 10/00 |
| 11,128,325 | B2 * | 9/2021 | Dinan | H01Q 9/065 |
| 2008/0049560 | A1 * | 2/2008 | Clarkson | G04G 17/08 29/896.33 |
| 2008/0238667 | A1 * | 10/2008 | Olson | G06K 19/07762 340/541 |
| 2008/0295032 | A1 * | 11/2008 | Gioscia | G06F 3/0338 715/840 |
| 2010/0060604 | A1 * | 3/2010 | Zwart | G06F 3/04886 345/173 |
| 2010/0128570 | A1 * | 5/2010 | Smith | G07C 9/00944 368/10 |
| 2012/0122519 | A1 * | 5/2012 | Jochheim | H04M 1/0202 455/556.1 |
| 2012/0212339 | A1 * | 8/2012 | Goldblatt | G08B 25/016 340/539.11 |
| 2014/0275850 | A1 * | 9/2014 | Venkatraman | A61B 5/318 600/301 |
| 2015/0346877 | A1 * | 12/2015 | Justice | G06F 1/163 345/173 |
| 2016/0035164 | A1 * | 2/2016 | Wu | G07C 9/00309 340/5.61 |
| 2016/0058133 | A1 * | 3/2016 | Fournier | G06F 21/32 455/41.2 |
| 2016/0061613 | A1 * | 3/2016 | Jung | G01C 21/26 701/49 |
| 2016/0070296 | A1 * | 3/2016 | Koo | G06F 1/1698 361/679.03 |
| 2016/0322999 | A1 * | 11/2016 | Kim | H01Q 1/36 |
| 2016/0343186 | A1 | 11/2016 | Jun et al. | |
| 2016/0380342 | A1 * | 12/2016 | Kenoun | H01Q 1/44 29/601 |
| 2017/0308347 | A1 * | 10/2017 | Garcia Manchado | G06F 3/14 |
| 2017/0309235 | A1 * | 10/2017 | Garcia Manchado | G09G 3/3208 |
| 2018/0013947 | A1 * | 1/2018 | Kim | H04N 5/232 |
| 2018/0120409 | A1 * | 5/2018 | Tropper | G01S 5/0231 |
| 2018/0157353 | A1 * | 6/2018 | Sleeman | H03K 17/975 |
| 2018/0368559 | A1 * | 12/2018 | Wang | G04G 21/00 |
| 2019/0118765 | A1 * | 4/2019 | House | G04B 47/00 |
| 2019/0176756 | A1 * | 6/2019 | Nicotra | G07C 9/00904 |
| 2019/0346926 | A1 * | 11/2019 | Kirisken | G06F 3/016 |
| 2020/0012912 | A1 * | 1/2020 | Klimt | G06F 1/163 |
| 2020/0192423 | A1 * | 6/2020 | Hsu | G06F 1/163 |
| 2021/0036728 | A1 * | 2/2021 | Dinan | G07C 9/20 |
| 2021/0125439 | A1 * | 4/2021 | Tu | G04G 17/02 |

OTHER PUBLICATIONS

Combined Search and Examination Report issued in corresponding application No. GB 1910793.7, dated Jan. 23, 2020, 5 pages.

* cited by examiner

WATCH INCORPORATING CAR KEY

TECHNICAL FIELD

The present disclosure relates to a wearable device. In particular, but not exclusively, the disclosure relates to a wearable device having the functionality to act as a wireless key for a vehicle.

BACKGROUND

Wrist-wearable devices are very widely used and may broadly be categorized as either "electronic" or "analog" devices. Electronic wearable devices have recently gained popularity. Such devices include smart watches, which typically include a touch screen controlled by a processor. In addition to telling the time, smart watches may also communicate with external devices via wireless communication protocols such as Bluetooth®, and they may provide various additional functions similar to those performed by a modern smartphone, albeit on a much smaller screen.

One other type of electronic wearable device having current applicability is a remote key fob that constantly (or intermittently or selectively) generates a weak radio signal capable of being detected by a radio receiver in a vehicle whereby the vehicle may be activated. For example, as a user wearing the device approaches a vehicle, the vehicle may be unlocked enabling entrance to the vehicle and the ignition to be enabled, allowing just the press of a button, for example, in the vehicle to start the vehicle operating. The device may have a button (as many remote key fobs presently employ) to unlock vehicles at a distance from them, rather than automatically unlocking on arrival at the vehicle. However, the commercially-available smart watches mentioned above typically do not incorporate the functionality to communicate with vehicle security systems that provide remote unlocking and/or activation of a vehicle. This may be because miniaturisation of the components required for unlocking and/or operating a vehicle to a sufficient extent to allow their incorporation within a casing of a smart watch has not yet been possible.

In contrast to the electronic devices mentioned above, analog watches typically only provide the functionality to tell the time via a clock face, with additional functions generally limited to a display of the day and date, and additional stopwatch features. Watches incorporating such stopwatch features may be referred to as "chronograph" watches. In certain market segments, it is considered essential for analog watches to employ a mechanical movement, in which the watch is powered by stored energy in a spring, that is discharged at a known rate through a complex clockwork arrangement, so as to turn the watch hands at a constant rate and display the correct time. Such movements are considered collectible due to the fact that they can endure for decades or even centuries provided they are properly maintained and serviced. They are also environmentally friendly, because they are generally powered by hand winding or by automatically harnessing mechanical energy as the user's wrist moves. Many users also appreciate the craftsmanship involved in the production of mechanical watch movements.

Because mechanical movements do not incorporate electronic components, miniaturisation is limited compared to electronically-controlled components. Miniaturisation of mechanical watch movements is particularly challenging if the movement is to incorporate stopwatch and/or date display features, as these features require the movement to be provided with additional mechanical complications, which can increase the overall package size required. Because mechanical watch movements typically occupy a lot of space, it has hitherto proved difficult to combine a mechanical watch with other features that it may be desirable to provide within a wearable device.

SUMMARY OF THE INVENTION

Aspects and embodiments of the invention provide a wearable device according to the appended claims.

According to an aspect of the invention for which protection is sought, there is provided a wearable device suitable for wearing on a user's wrist, comprising:

a substantially metal watch housing containing a mechanical watch movement;

a first strap connected to said watch housing; and a second strap connected to said watch housing;

wherein said first strap comprises a first cavity having a coin cell located therein; and wherein said second strap comprises a second cavity having a first electronic communication device located therein;

wherein the coin cell and the at least one electronic communication device are connected by a flexible circuit board, and wherein the first electronic communication device comprises a transmitter arranged to communicate with a first remote security system of a vehicle.

Advantageously, this arrangement allows a mechanical watch movement to be combined potentially bulky components necessary for communication with remote security systems of a vehicle, whilst maintaining the required flexibility for the wearable device to fit users having different sized wrists. Locating the communication elements in the straps has a further advantage in that whilst the watch is generally made from metals, especially precious metals, which would interfere with radio waves, the straps may be formed from a radio transparent material allowing for transmission of radio waves and communication with the vehicle. Precious metals may be highly radio-opaque, so locating the transceivers away from the watch body allows communication with security systems to be maintained even in premium products that incorporate large amounts of precious metals.

In an embodiment, at least one of the straps further comprises a second electronic communication device arranged to communicate with a second remote security system of the vehicle, the second electronic communication device being connected to said cell by the flexible circuit board. Further optionally, the second electronic communication device is located within the second cavity.

In an embodiment a portion or all of the housing is made of precious metal or precious stones.

Optionally, the wearable device of any preceding claim wherein the second communication device comprises a circuit for communicating with a keyless go system of the vehicle. Further optionally the second communication device is operable to confirm that the wearable device is inside the vehicle.

In an embodiment, the first communication device is arranged to communicate with a keyless entry system for unlocking the doors of the vehicle. Particularly advantageously, the present invention may allow a wearable device to interface with both a keyless entry system and a keyless go system of a vehicle.

Within the present specification, a "keyless entry" system may be considered to be any remote system that allows a user to enter their vehicle without the need for a mechanical key. Such systems may be passive, in the sense that no action is needed from the user to unlock the vehicle door apart from their presence in the vicinity of the vehicle with the wearable device about their person. Alternatively, a positive action may be required from the user to unlock the vehicle, such as a press of a button.

Within the present specification, a "keyless go" system is taken to mean any system that allows a user to start operation of a vehicle (either by starting the engine, or by putting the vehicle powertrain systems into a state in which they will respond to a user's demand to move the vehicle away from a rest position), without the need for the user to insert a mechanical key into the vehicle. Again, such systems may be passive, in the sense that no action is needed from the user to start the vehicle door apart from their presence in the vicinity of the vehicle with the wearable device about their person. Alternatively, a positive action may be required from the user to unlock the vehicle, such as a press of a button. The button to start the vehicle may be a button on the vehicle, or a button on the wearable device.

In an embodiment, the first and second communication devices comprise any of a near field communication device, a transponder, or a transceiver. The communication device may be arranged to communicate via any suitable wireless communication protocol such as Bluetooth® or ZigBee®.

Optionally, the wearable device comprises a button for activating said first communication device or the second communication device. Advantageously, the button may be arranged to lock or unlock the vehicle when the user is outside the vehicle, and/or to start the vehicle when the user is inside the vehicle. Other functions of the button are also contemplated. In some embodiments, different functions of the button may be available by providing different inputs via the button. Such inputs may include a long press for more than a predetermined amount of time, a short press for less than the predetermined amount of time, and repeat presses wherein the button is actuated more than once within a given time frame.

Optionally, the wearable device comprises a plurality of buttons. Each button may be associated with one or more of the non-exhaustive list of functions described above.

Optionally, the first strap and the second strap are at least partially formed of rubber. Advantageously, rubber is a radio-transparent material.

Optionally, at least one of the straps comprises an indicator. Further optionally the indicator comprises a light bulb, optionally wherein the light bulb comprises an LED.

The indicator may indicate any of: functionality status remaining cell charge, door lock status, vehicle fuel/charge status, internal vehicle temperature, or an unlock signal being sent or to indicate that the vehicle is within a predetermined range of the wearable device.

In an embodiment, the flexible circuit board is conformally coated. Advantageously, this protects the circuit board from ingress of moisture and dirt, whilst maintaining the flexibility of the circuit board.

In an embodiment the cell is potted within a cell housing. Advantageously, this protects the cell board from ingress of moisture and dirt In an embodiment, the substantially metal watch housing is waterproof. This protects the delicate components of the mechanical watch movement from moisture and dirt.

In an embodiment, the flexible circuit board comprises one or more rigid portions, the rigid portions being connected by flexible portions.

According to another aspect of the invention for which protection is sought, there is provided a wearable device suitable for wearing on a user's wrist, comprising:

a substantially metal watch housing containing a watch movement;

a first strap connected to said watch housing; and a second strap connected to said watch housing;

wherein said first strap comprises a first cavity having a cell located therein; and wherein said second strap comprises a second cavity having a first electronic communication device located therein;

wherein the coin cell and the at least one electronic communication device are connected by a flexible circuit board, and wherein the first electronic communication device comprises a transmitter arranged to communicate with a first remote security system.

The cell may be a coin cell. Alternatively, the cell may be a rechargeable cell.

Optionally, the watch movement is a mechanical watch movement.

The remote security system may be a remote security system of a vehicle. Alternatively, the remote security system may be a security system of a dwelling such as a house or a flat, or a security system of a safe. Accordingly, the present invention may be applicable to security systems that are not related to vehicles.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described by way of example only, with reference to the accompanying drawings, in which.

DETAILED DESCRIPTION

Figure 1:
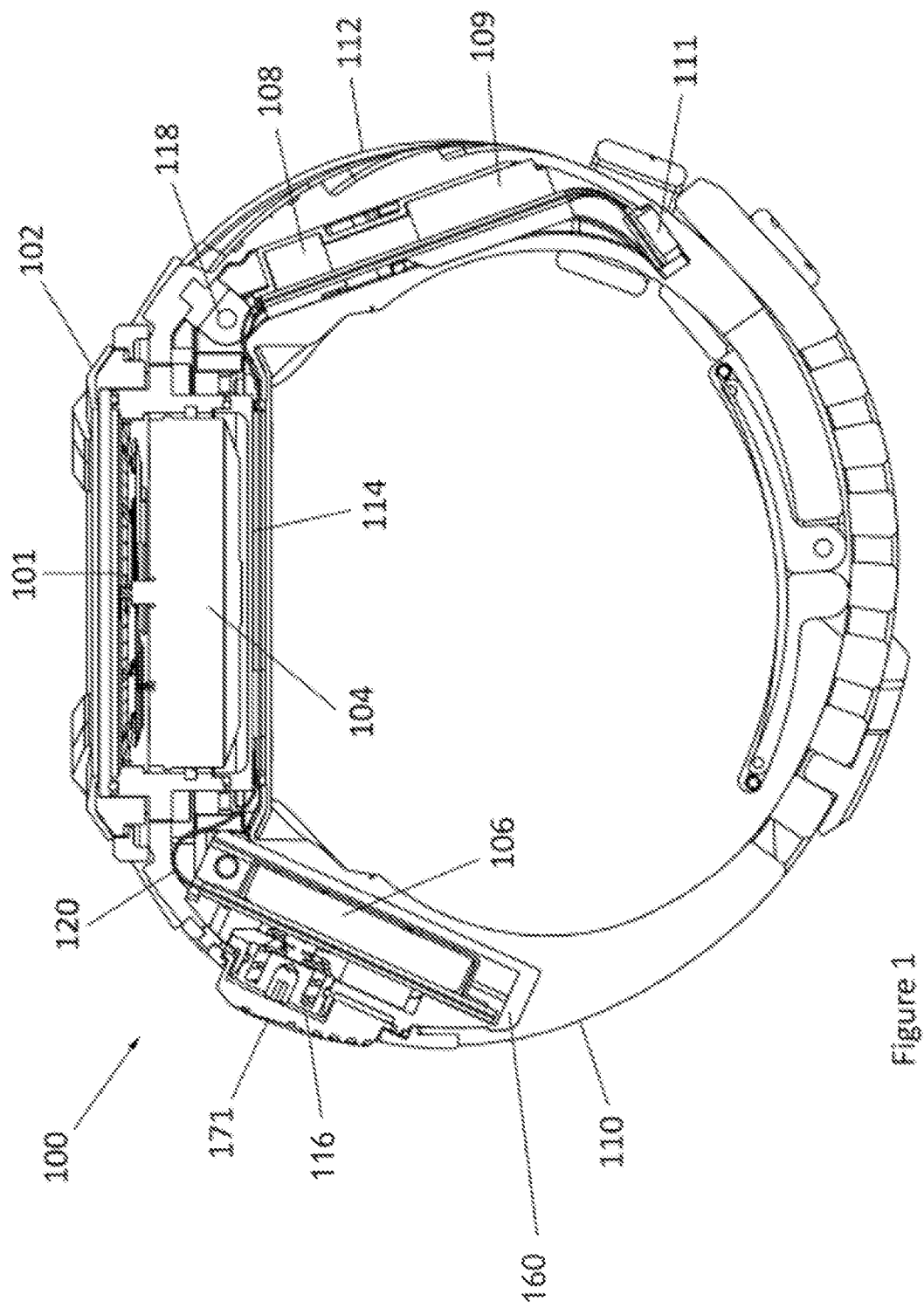
FIG. 1 shows a cross section through a side view of a wearable device according to an embodiment of the present invention.

FIG. 1 shows a cross section through a wearable device 100 according to an embodiment of the present invention. The wearable device combines the functionality of a conventional mechanical watch with apparatus for communicating with a remote security system. Although the present invention may have other applications, the invention will be described with particular reference to embodiments in which the security system is a remote security system of a vehicle, such as a keyless entry or a keyless go system.

The wearable device comprises first and second straps 110,112, which are each connected to opposite ends of a watch housing 102, which contains a mechanical watch movement 104. The watch movement is a conventional mechanical watch movement that controls several components including the hands of the watch face 101. In the illustrated embodiment, the watch movement also provides a stopwatch function and a date display function. However, it will be understood that a different type of mechanical watch movement may be provided in other embodiments.

The watch housing 102 is made of metal such that it is hard wearing and non-brittle. In some embodiments, the metal may be a precious metal such as gold or platinum. The components of the mechanical watch movement 104 are also made from metal. However, metals, especially precious metals, are generally radio opaque, meaning that communicating with a vehicle via radio antenna within the wearable device housing is not possible.

Each of the first and second straps are at least partially flexible, such that the wearable device 100 may be worn by users having different sized wrists. In the illustrated embodiment, this is achieved by forming part of each strap from a flexible rubber material. However, the skilled person will understand that other flexible materials could be used in other embodiments. Furthermore, although the two straps can be completely separated from each other in the illustrated embodiment, it will be understood that they could be connected by a fastening means that allows the wearable device to be opened and closed, such as a butterfly clasp.

The first strap 110 is provided with a cavity into which a battery housing 160 containing a coin cell 106 is inserted. The cavity is sized to substantially match the shape of the battery housing, but to be slightly smaller than the battery housing such that an interference fit exists between the walls of the cavity and the battery housing when the battery housing is inserted into the cavity.

The second strap 112 is also provided with a cavity. The cavity in the second strap is sized to receive a portion of a partially-flexible circuit board having one or more spaced-apart electronic communication devices that include, e.g., transceivers 108, 109, mounted on a rigid portion thereof. Each transceiver has an associated antenna. Again, the cavity is sized such that the circuit board and mounted transceivers are held in an interference fit in the cavity. Furthermore, it will be understood that the circuit board itself may be made entirely from flexible material, and that the rigid portions may be rigid by virtue of having rigid components mounted thereon The present invention allows the transmission of signals from the transceivers 108, 109, because the straps 110, 112, are formed from radio transparent materials. For example, the straps may be formed of rubber, optionally coated with leather or another radio-transparent material.

The array of transceivers 108, 109 are arranged to transmit radio signals which communicate with a vehicle, allowing a user to passively unlock the vehicle when the watch is within a predetermined range. This may be referred to as a keyless entry system. Keyless entry systems typically work by the vehicle intermittently transmitting signals, which are received by a transceiver of the keyless entry system. Upon receipt of the signal from the vehicle, the transceiver produces a signal comprising a code which can be received by the vehicle. If a signal indicating a "correct" code is received by the vehicle, then the doors are automatically unlocked, with no further action from the user being required.

In addition to a keyless entry functionality, the array of transceivers 108, 109 also provide a "keyless go" function, which allows a user to start operation of a vehicle simply by pressing a button to start the engine (or, in the case of an electric or hybrid vehicle, to put the electric machine and other powertrain components in a "ready" state in which they will respond to a user's request to commence movement of the vehicle). The button may be a button on the vehicle's dashboard, or a button on the key (which is the wearable device 100 in the context of the present invention).

The keyless go system requires additional transceivers to the keyless entry system, as it is necessary for the vehicle to determine that the key is actually within the vehicle before allowing the vehicle to be driven away. This is typically achieved by one of the transceivers 108, 109 receiving signals which are transmitted from various positions within the vehicle, and providing a predetermined response to each of the signals. The vehicle is then operable to determine the position from which the responses originated, and the keyless go function is only activated in the event that the vehicle determines that the responses are the expected responses and that they originated from within the vehicle.

The wearable device 100 is provided with a button 171 attached to the strap 110, which button may be operable to cause a signal to be sent, which signal may cause a vehicle to start if it is sent from within the vehicle. However, it will be understood that the functionality available by pressing the button 171 will depend on the specific vehicle that the wearable device 100 is arranged to unlock and start. In some embodiments, the button may cause a signal to be sent that operates to unlock the vehicle from a relatively large distance away, in the manner of a conventional remote key.

A particular challenge associated with provision of keyless go and keyless entry functionality is that a relatively large amount of energy and a relatively high peak current is required to run the array of transceivers for these functions. Further, a large amount of energy will also need to be stored for the keyless entry functionality, because for some keyless entry systems the respective transceiver may need to be transmitting constantly (albeit at a very low power level). The present inventors have recognised that the peak current required by a keyless entry circuit may be in the region of 10 mA for some keyless entry systems. Accordingly, it is necessary to provide a cell that is able to provide this peak current and store an amount of energy that allows the wearable device to function for a required length of time before the battery needs to be replaced. It is also important for the cell to be relatively compact, as package space within the wearable device is limited. A suitable cell 106 may be a CR2032 coin cell.

Placing the cell 106 under the mechanical watch movement 104 may make the watch uncomfortably tall for the user. Therefore, the cell 106 is placed in a cavity in the first strap 110. Placing the cell 106 and the radio array in different straps ensures that the size of each strap does not become unacceptably large, and allows the straps to retain sufficient flexibility to remain comfortable for a user.

However, since the mechanical watch movement 104 is located between the cell and the array of transceivers, a connection between the two is required. Due to the fact that the watch straps will need to bend to fit the wrist of the user, the electrical connection is required to be flexible and capable of surviving material fatigue due to the user repeatedly removing and replacing the watch upon their wrist.

Therefore, the printed circuit board 120 is formed of a material capable of surviving this material fatigue as required.

Figure 2:
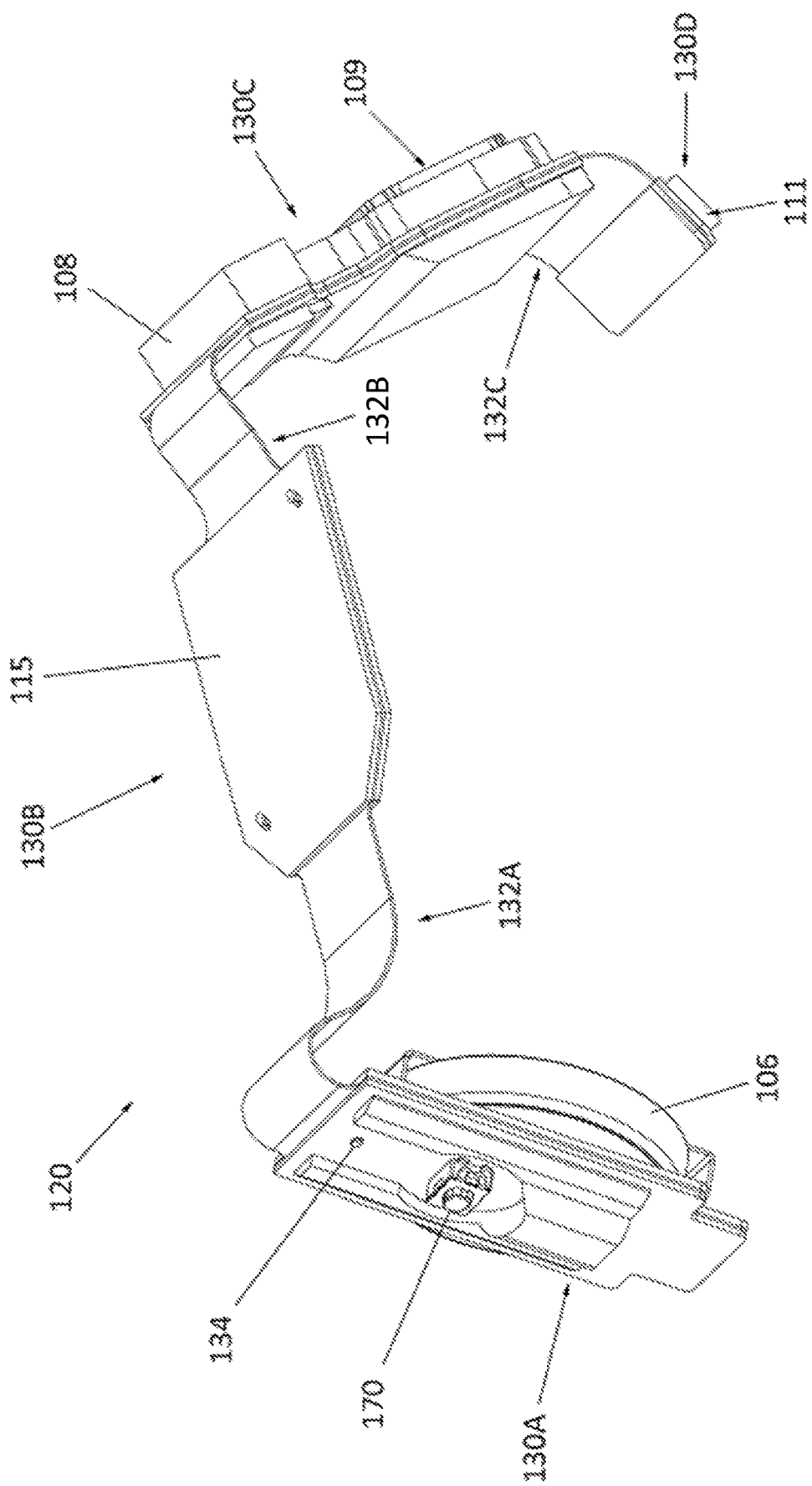
FIG. 2 shows a printed circuit board for use in embodiments of the present invention.

FIG. 2 shows a detailed view of the circuit board 120. The circuit board 120 comprises first, second, third and fourth rigid portions 130A-D, connected by first, second and third flexible portions 132A-C.

The first rigid portion 130A houses the cell 106 and an input 170 arranged to be pushed by button plunger 116 when the user presses the button 171. An output in the form of an LED 134 is also positioned on the first rigid portion. In use, the first rigid portion is housed within the first strap 110.

The first flexible portion 132A connects the first rigid portion 130A to the second rigid portion 130B, and is arranged to pass between the first strap and the watch housing 102.

The second rigid portion 130B is placed underneath the watch housing 102, and houses a controller 115 that is arranged to control the LED 134, optionally in dependence on signals received from the input 170. It will be understood that it is not essential for a rigid portion to be provided underneath the watch housing 102. Accordingly, in some embodiments, a flexible portion may pass underneath the watch housing and connect the components in the straps. Furthermore, in some embodiments, control logic for a different function of the wearable device may be positioned under the watch housing on the second rigid portion.

The second flexible portion 132B connects the second rigid portion 130B to the third rigid portion 130C, and is arranged to pass between the watch housing 102 and the second strap 112.

The third rigid portion houses the transceivers 108, 109, and the antenna for one of the transceivers.

The third flexible portion 132C connects the third rigid portion 130C to the fourth rigid portion 130D, and is positioned within the second strap 112. Providing a two separate rigid portions separated by a flexible portion within the second strap may allow various different components to be provided within the second strap, whilst maintaining adequate flexibility of the second strap.

The fourth rigid portion houses an antenna 111 for one of the transceivers 108, 109.

Advantageously, the printed circuit board 120 described above provides a flexible arrangement that is able to connect the required electronic components for providing both "keyless entry" and "keyless go" functionalities within straps connected to a mechanical watch movement, without significantly increasing the height of the watch movement.

Figure 3:
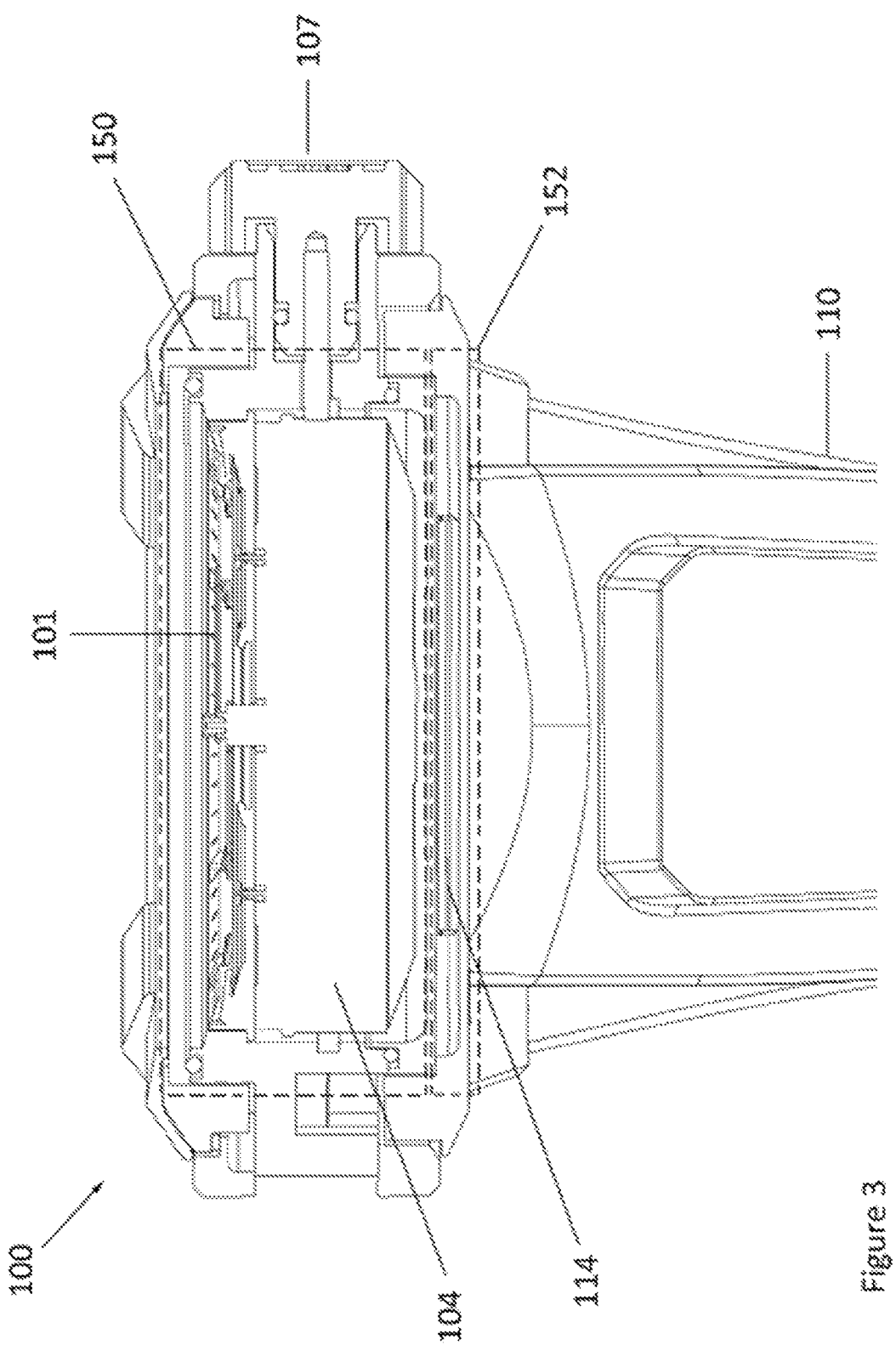
FIG. 3 shows another cross section through the wearable device shown in FIG. 1.

FIG. 3 shows a cross section through the wearable device 100 shown in FIG. 1, with the cross section taken along a plane that is perpendicular to the plane of the cross section in FIG. 1. The highlighted area 150 is waterproofed and includes the watch movement 104 and the watch face 101. The highlighted area 152 is not enclosed within a waterproof casing, as the PCB 114 needs to reach from the first strap 110 to the second strap 112 and as such cannot enter and exit the waterproofed area 150 without reducing the efficacy of the seal. The PCB will be fixed to the watch body, which will offer protection from most moisture and dirt for the side that is fixed to the body. Furthermore, the PCB has its own waterproofing in the form of conformal coating as will be described in more detail below.

Another important feature of the wearable device 100 is that appropriate ingress protection (protection from liquids and dust) is provided for each of the different components. As can be best seen from FIG. 3, the watch housing 102 is waterproofed according to standard waterproofing methods such that the watch movement and watch face are never exposed to liquid or excess moisture.

The wearable device also comprises a crown 107 which can be pulled or pushed to different positions to vary its function. The crown allows a user to set the date and time, start a stopwatch or wind the movement mechanism. The fittings of the crown are also waterproof and dustproof, using conventional waterproofing methods.

The electrical components including the cell 106, printed circuit board 114 and the array of transmitters and transceivers 108, 109, need to be waterproofed by different methods which allow for the transmission of electricity and radio signals, and to maintain the flexibility of the parts of the circuit board that are required to flex when the wearable device 100 is in use.

Figure 4:
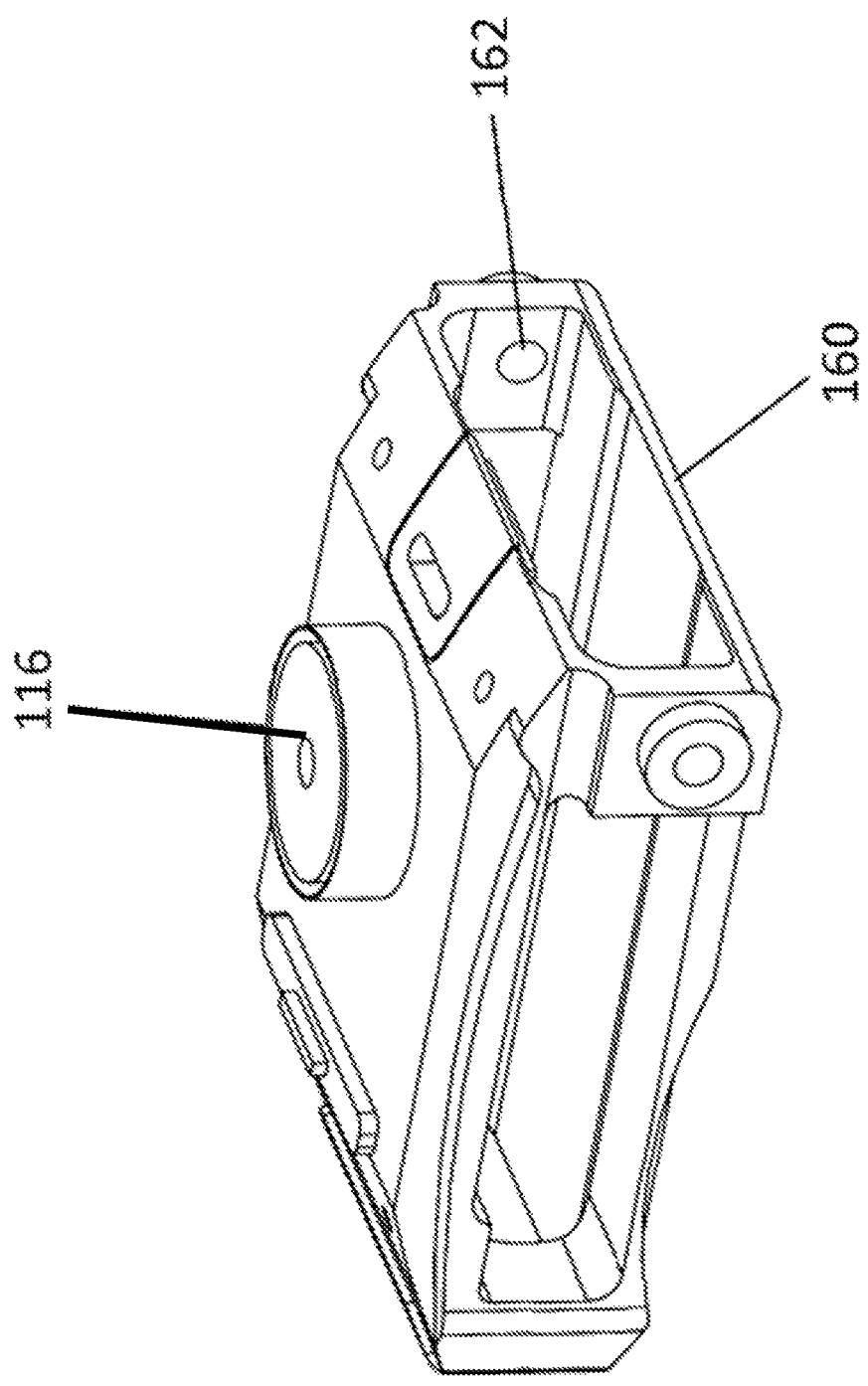
FIG. 4 shows a cell housing for use in embodiments of the present invention.

The cell 106 waterproofed by "potting" the cell within the housing 160, which is shown in detail in FIG. 4, this provides an additional layer of protection instead of or in addition to conformal coating, ensuring that the voids around the cell are filled. Once the cell is mounted on the circuit board, it is placed within the housing in a desired position. The process of potting the cell then involves filling the housing with a liquid resin material which is then allowed to cure, sealing the electrical components such that they are protected from environmental factors such as moisture and a strong lasting connection is formed between the cell 106, printed circuit board 120 and the housing 160. This effectively prevents damage due to vibration of the cell or ingress of water or dust for the entire lifetime of the cell 106.

When the cell requires replacement, a service technician is able to remove the cell housing 160 from the cavity in the first strap 110, and then placing the housing in a solvent which will dissolve the resin, allowing the cell 106 to be removed from the housing and disconnected from the flexible circuit board. The process of attaching the cell to the printed circuit board and potting the cell 106 within the housing 160 can then be repeated with a new cell.

The parts of the printed circuit board that are not potted with the cell, and the array of transducers are waterproofed by conformally coating them, which in addition to the cavities within the straps in which they are located prevents moisture, dirt and other contaminants from interfering with the electrical components whilst allowing the flow of electricity through the PCB and radio waves to propagate from the array. The conformal coating also maintains the required flexibility of the flexible parts 132A-C of the printed circuit board 120.

In the illustrated embodiment, the parts to be conformally coated are sprayed with a waterproof resin. However, conformal coating may be added by many methods and most would be appropriate for the present purposes.

Figure 5:
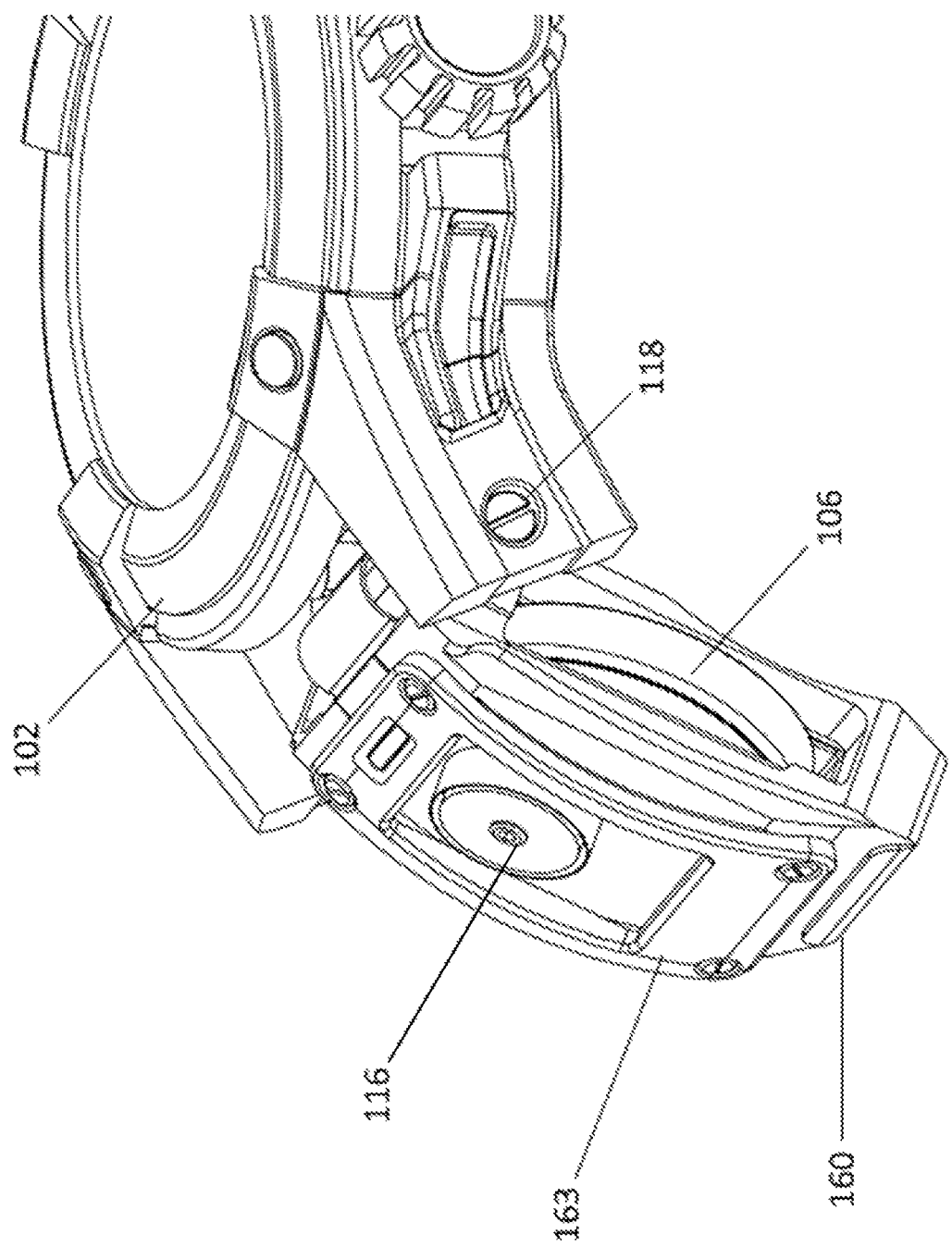
FIG. 5 shows the cell housing shown in FIG. 4 as attached to a watch body.

The straps are connected to the watch housing by screws 118. Screws 118 may have a non-threaded end portion, such that a single rotational degree of freedom is provided between each of the straps 110, 112 and the housing 102. As shown in FIG. 5, the first strap 110 is attached to the housing 102 by attaching the cell housing 160, which is located within a cavity of the first strap, to the housing 102. The cell housing includes female-threaded bores 162 (of which only one is visible in FIG. 4) that allow the screws to be connected to the first strap 110 via the cell housing 160. Alternatively, the straps may be connected using spring bars, rivet ended bars, pressure bars or threaded bars.

The cell housing 160 also has a button plunger 116 attached to it, which button plunger is mounted on the cell housing 160 and is arranged to press the input 170 on the printed circuit board 120, such that pressing the button can affect the functionality of the wearable device, for example by causing one or more of the transceivers to emit a signal configured to have a desired effect on the paired vehicle. A plate 163 is also attached to the cell housing which provides a decorative face, but also helps to secure the strap to the watch body.

In some embodiments, the button 171 may have multiple functions. Without limitation, these functions may include commanding a radio pulse from the transceiver which may lock or unlock the doors of the vehicle, or start the engine of the vehicle, or activate the horn/lights of the vehicle to aid a user in finding it, for example in a large car park, or to open a boot, or trunk compartment of the vehicle, or to cause the door handles of a vehicle to move from a retracted position inside the vehicle door to an active position in which they are operable to open the door. The different functions may be accessed through a variety of different "presses" of the button. For example a single short press may activate the horn when sensors in the vehicle detects that the watch is within a certain distance, whereas a long press when the watch is within the vehicle may activate the engine. These examples are not intended to be limiting, and further functions may be accessible by repeatedly pressing the button a predetermined number of times. As another example, a double press which may activate a parking assistant in the vehicle, and a triple press may send a request to the vehicle to drive to the user etc.

Figure 6:
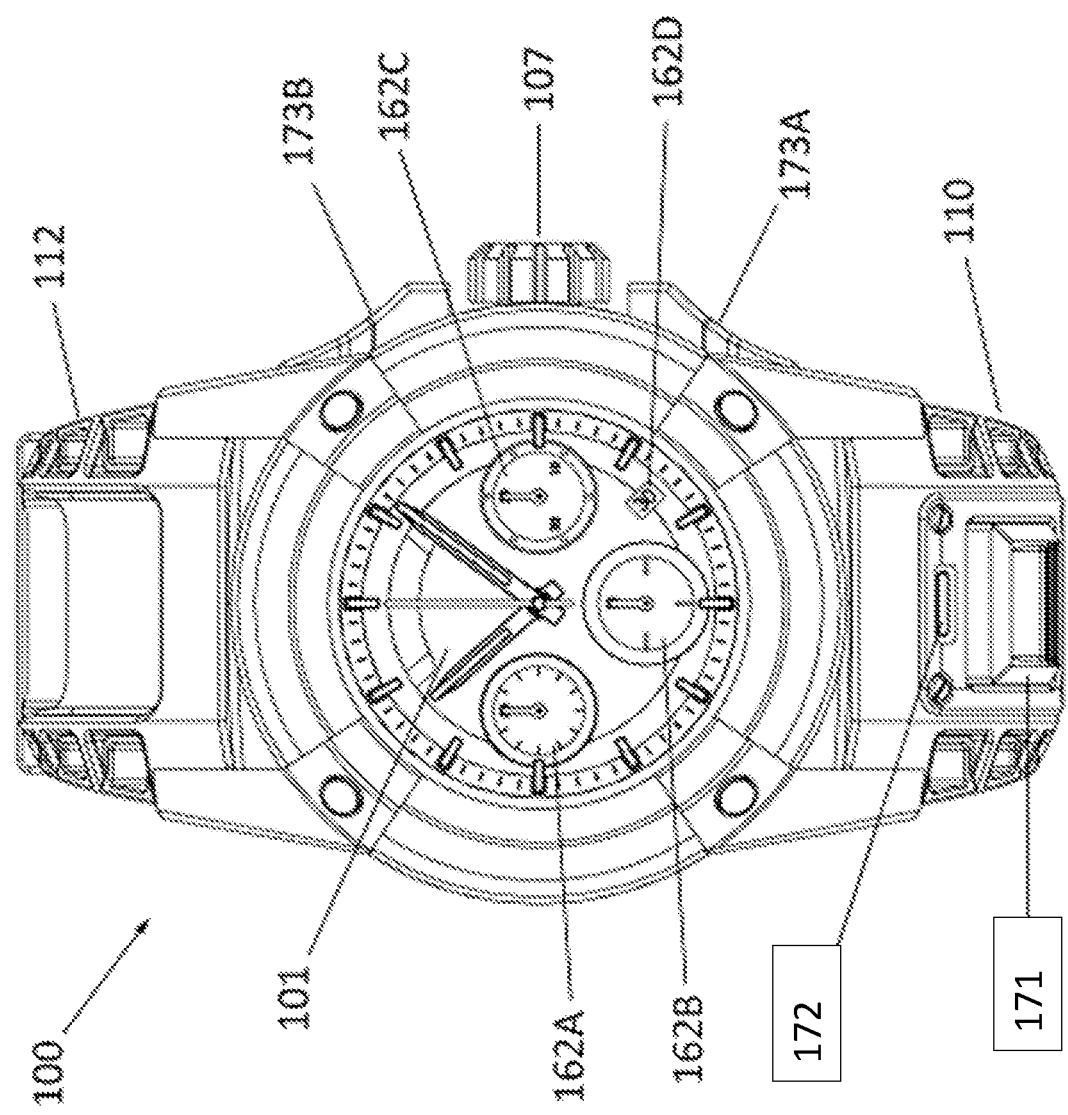
FIG. 6 shows a top view of the wearable device shown in previous figures.

FIG. 6 shows the assembled wearable device 100. As shown in FIG. 5, the wearable device comprises a watch face 101. The watch face 101 is protected by a sapphire crystal, which closes the top surface of the watch housing 102. The watch face includes a main dial and three smaller dials 162A-C that show chronograph functions, and a date display window 162D. The functions of the chronographs 162A-C may include displaying the day, month, a stopwatch, or any other chronograph feature. The functions of the chronograph displays 162A-C can be controlled and reset by the pushers 173A, 173B on either side of the crown.

A button 171 is set into the strap 112 along with an LED indicator 172. The functions of the button may be controlled by logic circuits within the wearable device 100. The button 171, logic circuits, cell, LED indicator 172 and antenna array are interconnected such that the LED indicator 172 can display information about the status of the watch and/or the status of the vehicle. The LED indicator may be capable of lighting up in various colours, blinking, or varying in brightness to display various information. Some examples of different information which the LED indicator may display include blinking red to indicate that the cell needs to be replaced, showing solid green to indicate that the vehicle is within communication range, blinking green to remind a user that the vehicle is unlocked, blinking orange if detectors in the vehicle discover the interior temperature is above a certain threshold or blue if an anti-theft alarm is activated on the vehicle.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A wearable device suitable for wearing on a user's wrist, comprising:
   a substantially metal watch housing containing a mechanical watch movement;
   a first strap connected to said watch housing; and
   a second strap connected to said watch housing;
   wherein said first strap comprises a first cavity having a coin cell located therein; and
   wherein said second strap comprises a second cavity having a first electronic communication device located therein;
   wherein the coin cell and the first electronic communication device are connected by a flexible circuit board, wherein the flexible circuit board comprises one or more rigid portions, the rigid portions being connected by flexible portions,
   and wherein the first electronic communication device comprises a transmitter arranged to communicate with a first remote security system of a vehicle,
   further comprising a button set into one of the first strap and the second straps for activating said first electronic communication device;
   wherein the one of the one or more rigid portions houses an input arranged to be pushed by a button plunger when a user presses the button.

2. The wearable device of claim 1 wherein at least one of the straps further comprises a second electronic communication device arranged to communicate with a second remote security system of the vehicle, the second electronic communication device being connected to said cell by the flexible circuit board.

3. The wearable device of claim 2, wherein the second electronic communication device comprises a circuit for communicating with a keyless go system of the vehicle.

4. The wearable device of claim 3 wherein the second electronic communication device is operable to confirm that the wearable device is inside the vehicle.

5. The wearable device of claim 2, wherein the first and second electronic communication devices comprise any of a near field communication device, a transponder, or a transceiver.

6. The wearable device of claim 2, further comprising a button for activating the second electronic communication device.

7. The wearable device of claim 1, wherein the first electronic communication device is arranged to communicate with a keyless entry system for unlocking the doors of the vehicle.

8. The wearable device of claim 1, wherein the first strap and the second strap are at least partially formed of rubber.

9. The wearable device of claim 1, wherein at least one of the first strap and the second strap comprises an indicator.

10. The wearable device of claim 9, wherein the indicator comprises a light bulb, optionally wherein the light bulb comprises an LED.

11. The wearable device of claim 9 wherein the indicator indicates any of: functionality status remaining cell charge, or to indicate that the vehicle is within a predetermined range of the wearable device.

12. The wearable device of claim 1, wherein the flexible circuit board is conformally coated.

13. The wearable device of claim 1, wherein the cell is potted within a cell housing.

14. The wearable device of claim 1, wherein the substantially metal watch housing is waterproof.

* * * * *